United States Patent [19]

Takano et al.

[11] Patent Number: 4,684,973
[45] Date of Patent: Aug. 4, 1987

[54] SEMICONDUCTOR INTEGRATED CIRCUIT DEVICE HAVING GROUND CONNECTIONS ARRANGED TO ELIMINATE MUTUAL INTERFERENCE BETWEEN ISLAND-DISPOSED ELECTRONIC CIRCUITS

[75] Inventors: Hajime Takano; Hiromitsu Yamashita, both of Hyogo, Japan

[73] Assignee: Mitsubishi Denki Kabushiki Kaisha, Tokyo, Japan

[21] Appl. No.: 808,240

[22] Filed: Dec. 13, 1985

Related U.S. Application Data

[63] Continuation of Ser. No. 474,941, Mar. 14, 1983, abandoned.

[30] Foreign Application Priority Data

Mar. 15, 1982 [JP] Japan .................................. 57-43531

[51] Int. Cl.$^4$ ........................ H01L 23/52; H01L 23/48
[52] U.S. Cl. ........................................ 357/68; 357/48; 357/75
[58] Field of Search ............... 357/48, 68, 71, 67, 357/75

[56] References Cited

U.S. PATENT DOCUMENTS 3,688,132  8/1972  Gill et al. ............................. 357/48
4,403,240  9/1983  Seki et al. ............................ 357/48

OTHER PUBLICATIONS

Fairchild Epitaxial Micrologic Publication-1963.

*Primary Examiner*—Andrew J. James
*Assistant Examiner*—S. V. Clark
*Attorney, Agent, or Firm*—Sughrue, Mion, Zinn, Macpeak and Seas

[57] ABSTRACT

A semiconductor integrated circuit contains a plurality of electronic circuit portions formed thereon, each of which includes an earth wiring. Mutual interference between the circuit portions is reduced by connecting the earth wirings to a common earth electrode, and connecting only a part of the earth wirings to an earth point of the semiconductor substrate.

7 Claims, 6 Drawing Figures

SEMICONDUCTOR INTEGRATED CIRCUIT DEVICE HAVING GROUND CONNECTIONS ARRANGED TO ELIMINATE MUTUAL INTERFERENCE BETWEEN ISLAND-DISPOSED ELECTRONIC CIRCUITS

This is a continuation of application Ser. No. 474,941, filed 3/14/83, abandoned.

BACKGROUND OF THE INVENTION

This invention relates to a semiconductor intergrated circuit device, and in particular to an earth wiring structure for reducing mutual electrical interference among a plurality of earth wirings included in a semiconductor integrated circuit.

FIG. 1 shows the earth wirings and a wire bonding electrode structure of a conventional semiconductor integrated circuit device, and FIG. 2 is a cross-section of this structure taken along the line II—II in FIG. 1. Numeral 1 denotes one conductivity type single semiconductor substrate (for example, p-type silicon). Numerals 5 and 6 denote island regions among semiconductor layers 20 of the opposite conductivity type (for example, N-type epitaxial layers) which are formed so as to extend downwardly from a main surface of the substrate. These island regions are separated by separation regions 2, 3 and 4 each consisting of, for example, a P-type diffusion layer. Numerals 7 and 8 denote electronic circuits each representing an element (for example, resistors comprised of a P-type diffusion layer formed in the island regions 5 and 6, respectively). Numerals 00, 400 and 500 denote earth wirings connected to the respective electronic circuits (for example, and Al vacuum deposition layer). At 14 is an earth electrode, i.e., a common earth electrode (for example, an Al vacuum deposition layer) for collecting the respective earth wirings at a single point. At 26 is an insulating layer (for example, silicon dioxide). Numerals 9, 10, 11, 12 and 13 denote electrodes. $R_0$, $R_4$, $R_5$, $R_6$, $R_7$, $R_8$, $R_9$ and $R_{10}$ are the intrinsic parasitic impedances of the respective structures. In FIG. 2, numerals 00, 400, 500 and 14 conceptionally denote the same structures as those indicated by the same numerals in FIG. 1. In the drawings, the two electronic circuits 7 and 8 are electrically separated from each other by separation structures including the separation regions 2, 3 and 4. Circuit electrodes 10 and 12 to be grounded are respectively electrically connected to the substrate earth electrodes 9 and 11 formed on the separation regions 2 and 3 via unnumbered substrate earth wirings which run respectively close to the circuit electrodes 10 and 12. Further, the respective circuit earth wirings 00 and 500 are electrically connected to the wire bonding earth electrode 14 for wire bonding. It can be considered that the substrate electrical potentials of the electrodes 9 and 11 are the same as that of the substrate, respectively.

It is well known however that the electric paths of the thus arranged semiconductor integrated circuit have finite impedances $R_0$, $R_5$, $R_6$, $R_7$ and $R_9$. In an actual example, the following values have been obtained: $R_0=50 m\Omega$: $R_5=1\Omega$; $R_6=20\Omega$; $R_7=20\Omega$;and $R_9=50\Omega$.

Assume now that the respective signal currents $I_7$ and $I_8$ flowing from the circuits 7 and 8 are 10 mA and 10 mA and that the potential of the bonding electrode 14 is zero volts. At this time, the equivalent circuit is as shown in FIG. 3, in which impedances considered to be sufficiently small are eliminated. In the equivalent circuit, the potential $V_8$ at the earth point 12 of the electrode circuit 8 can be obtained as follows:

$$V_8 = R_5 I_5 \tag{1}$$

$$R_5 I_5 = R_0(I_7+I_8-I_5)+(R_6+R_7+R_9)(I_8-I_5) \tag{2}$$

$$I_5 = \frac{R_0 I_7 + (R_0 + R_6 + R_7 + R_9) I_8}{R_0 + R_5 + R_6 + R_7 + R_9} \tag{3}$$

Let $R_0+R_5+R_6+R_7+R_9=R_{100}$, then $$V_8 = \frac{R_0 I_5}{R_{100}} I_7 + \frac{(R_0 + R_6 + R_7 + R_9)R_5}{R_{100}} I_8 \tag{4}$$

Substituting the above-mentioned impedances in the actual example and the signal current values into equation (4):

$$V_8 = 5.5\times10^{-6} + 9.9\times10^{-3} \tag{5}$$

Thus, the earth point of the electron ic circuit 8 is subject to an interference of 5.5 $\mu V$ due to the influence of the electronic circuit 7. This means that the electronic circuit 8 is subject to an interference of $-45.2$ dB ($5.5\mu V/1$ mV) from the electronic circuit 7, if it is assumed that the electronic circuit 8 equivalently has the performance gm$=10$ mA/1 mV$=10$ m$\Omega$. Generally, it is fully understood that sometimes such an interference level ($-45.2$ dB) cannot be disregarded.

Thus, the conventional earth wiring structure has disadvantages in that electrical interference is apt to occur between the electronic circuits, resulting in a deterioration in the signal quality due to interference by unnecessary signals, particularly in a high gain high-frequency circuit, somtimes resulting in oscillation which may affect the normal amplifying function of the circuit.

SUMMARY OF THE INVENTION

The present invention is intended to eliminate the disadvantages of the prior art, and has an object of providing a semiconductor integrated circuit device comprising an earth wiring structure in which the earth wirings of two or more electronic circuits formed on a common semiconductor substrate are not necessarily connected to the semiconductor substrate in the vicinity of their own electronic circuits, but where at least one of or only a part of the earth wirings are connected to the semiconductor substrate, so as to reduce or obviate the mutual interference between the electronic circuits.

DETAILED DESCRIPTION OF THE PREFERRED EMBODIMENTS

Figure 1:
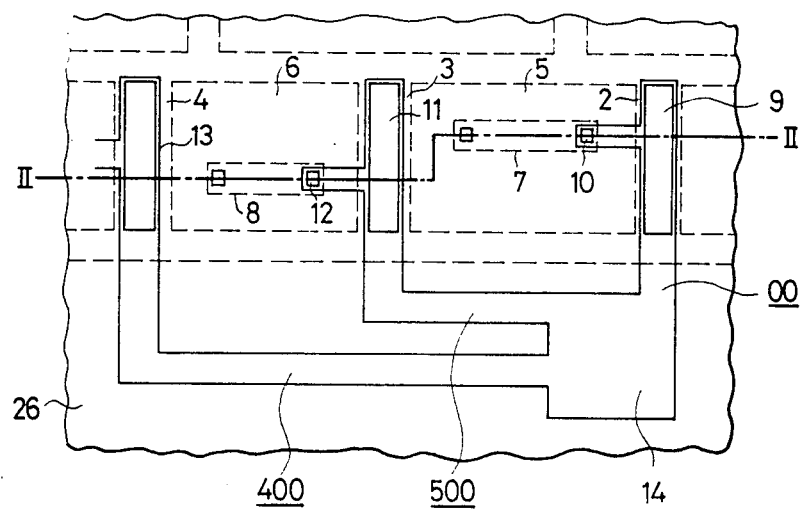
FIG. 1 is a plan view showing the earth wiring structure of a conventional semiconductor integrated circuit device.
Figure 2:
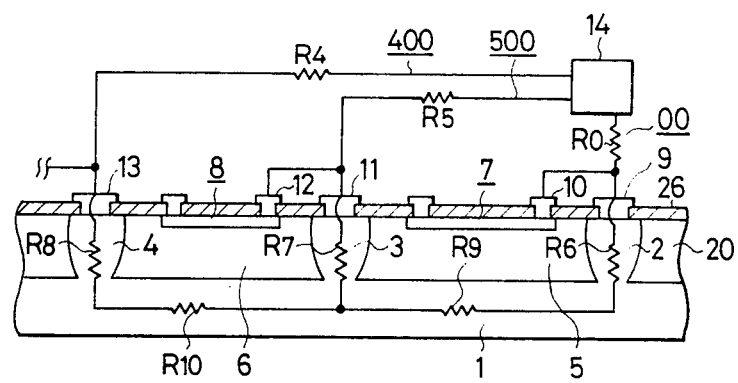
FIG. 2 is a cross-sectional view taken along line II—II of FIG. 1.
Figure 4:
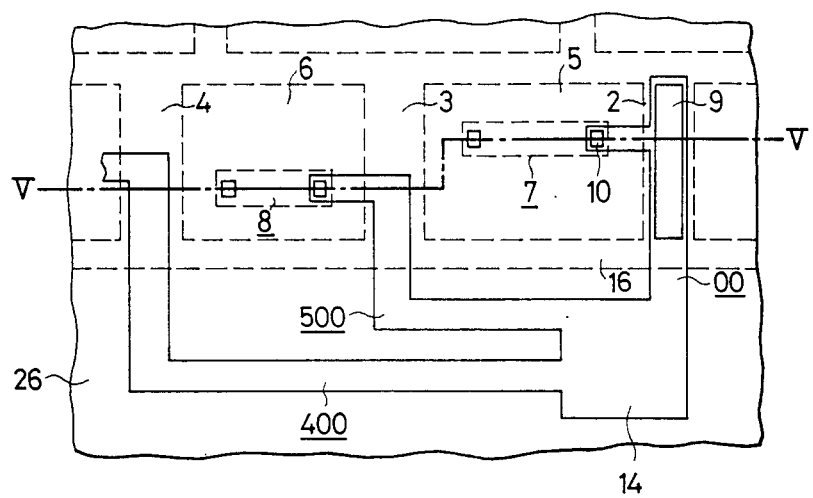
FIG. 4 is a plan view showing the earth wiring structure of the semiconductor integrated circuit device according to the present invention.
Figure 5:
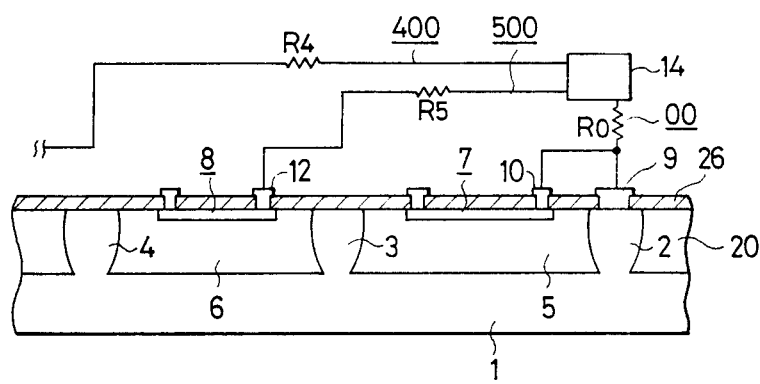
FIG. 5 is a cross-sectional view taken along line V—V.
Figure 6:
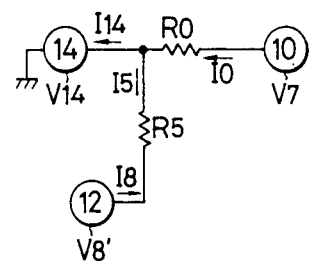
FIG. 6 is an equivalent circuit diagram of the earth wiring paths of FIG. 4.

A preferred embodiment of the present invention will now be described. FIG. 4 shows the earth wiring and wire bonding electrode structure of a single semiconductor integrated circuit according to the present invention. FIG. 5 shows a cross-section of this structure taken along line V—V in FIG. 4. In FIGS. 4 and 5, the same parts as in FIGS. 1 and 2 are indicated by the same reference numerals. In the drawings, two electronic circuits 7 and 8 are electrically separated from each other by a separation structure including separation regions 2, 3 and 4. Only the earth wiring 00 of the electronic circuit 7 is connected by a substrate earth wiring (unnumbered) to an electrode (9) formed on a separation region (2), i.e., an earth electrode for the substrate 1, as well as to the bonding earth electrode (common earth electrode) 14. The earth wiring 500 of the other electronic circuit 8 is not wired to separation region 3 in the vicinity of the circuit 8 but is directly connected by wiring to the bonding earth electrode 14. Though the thus wired semiconductor integrated circuit has finite impedance in its electric paths, it is different from the prior art in that it does not include impedances $R_6$, $R_7$ and $R_9$ of the FIG. 3 equivalent circuit, as will be seen in the equivalent circuit of FIG. 6.

Figure 3:
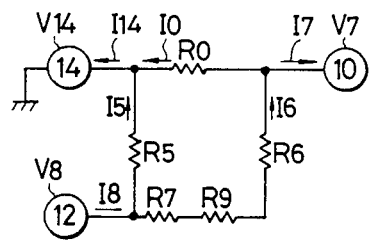
FIG. 3 is an equivalent circuit diagram of the earth wiring paths of FIG. 1.

Using values corresponding to the prior art of FIG. 3, the respective impedance $R_0$ and $R_5$ were $R_0 = 50m\Omega$ and $R_5 = 1\Omega$ in an actual example. Assume now that the respective signal currents $I_7$ and $I_8$ flowing from the circuits 7 and 8 are 10 mA and 10 mA, and that the potential of the bonding electrode 14 is zero volts. In the equivalent circuit of FIG. 6 the potential $V'_8$ at the earth point 12 of the electronic circuit 8 can be obtained as follows:

$$V'_8 = R_5 I_5 = R_5 I_8 \qquad (5)$$

That is, the potential $V'_8$ at the earth point 12 is not affected by the current $I_7$ but depends only on the impedance $R_5$ and the current $I_8$. Thus, no mutual interference occurs.

Although only two electronic circuits are shown in the above-mentioned embodiment, it is apparent that quite the same results can be obtained even in a case where more than two electronic circuits are included.

Further, it is possible to arrange a semiconductor circuit structure with no mutual interference among the several electronic circuits by developing the embodiment of the present invention such that the earth electrodes and the bonding earth electrodes of numbers of electronic circuits are divided into a plurality of groups. The respective earth electrodes such as 9, 11 and 13 described above can be taken from the reverse surface of the substrate 1 instead of the front surface thereof.

As forementioned, according to the present invention, the mutual interference between electronic circuits is easily reduced or eliminated in a manner such that only a part of the plurality of earth wirings connecting two or more electronic circuits formed on a common semiconductor substrate to an earth electrode common to the respective electronic circuits is connected to an earth point of the semiconductor substrate.

What is claimed is:

1. A semiconductor integrated circuit device, comprising; at least two electronic circuit portions formed in a common semiconductor substrate, at least two island regions wherein said electronic circuit portions are respectively formed, a plurality of separation regions respectively formed between adjacent island regions and being electrically contiguous with said substrate, earth electrodes for said substrate being disposed on ones of said separation regions, substrate earth wirings having first and second ends and being connected at first ends to said earth electrodes, a plurality of circuit earth wirings having first and second ends and being connected at first ends to said electronic circuit portions, and a common earth electrode formed on said semiconductor integrated circuit device and directly connected to the second ends of said substrate earth wirings and to a substantial majority of the second ends of said circuit earth wirings, a substantial minority of said second ends of said circuit earth wirings being electrically connected to adjacent ones of said substrate earth wirings, wherein the number of said substrate earth wirings connected to said circuit earth wirings is limited in a manner so as to reduce mutual interference between said circuit portions by reducing the effect of intrinsic parasitic impedances of the circuit device.

2. A semiconductor integrated circuit device as claimed in claim 1; wherein said semiconductor substrate is formed of a first semiconductor layer of one conductivity type, a second semiconductor layer of the opposite conductivity type being formed on said first semiconductor layer, said second semiconductor layer being divided into said island regions by said separation regions, said separation regions being of said one conductivity type and extending downwardly from the surface of said substrate.

3. A semiconductor integrated circuit device as claimed in claim 2, wherein said second semiconductor layers are epitaxially grown layers and said separation regions are impurity diffusion layers.

4. A semiconductor integrated circuit device, comprising;
   a semiconductor substrate of a first conductivity type,
   first and second island regions of a second conductivity type formed in one main surface of said substrate, said first and second island regions being separated from one another by a separation region of said first conductivity type,
   a common earth electrode formed on said one main surface of said substrate,
   a substrate earth electrode electrically connected to said separation region and disposed adjacent to said first island region, and said substrate earth electrode being electrically connected through a substrate earth wiring to said common earth electrode,
   a first electronic circuit portion having a first electrode formed on said first island region, a circuit earth wiring for electrically connecting said first electrode to said common earth electrode, said circuit earth wiring being joined to said substrate earth wiring at a location of said substrate earth wiring between said first electrode and said common earth electrode,
   a second electronic circuit portion having a second electrode formed on said second island region, and a circuit earth wiring for directly connecting said second electrode to only said common earth electrode.

5. A semiconductor integrated circuit device as claimed in claim 1; only one of said plurality of said circuit earth wirings being connected to said substrate earth electrode.

6. A semiconductor integrated circuit device as claimed in claim 1, wherein a first of said electronic circuit portions is grounded via a first one of said circuit earth wirings, said first circuit earth wiring being electrically connected to one of said substrate earth electrodes via a substrate earth wiring, and wherein further ones of said electronic circuit portions adjacent to said first electronic circuit portion are grounded via further ones of said circuit earth wirings, said further ones of said circuit earth wirings being electrically disconnected from said one substrate earth electrode, and being electrically connected to said common earth electrode.

7. A semiconductor integrated circuit device, comprising; at least two electronic circuit portions (7, 8) formed in a common semiconductor substrate (1), at least two island regions (5, 6) wherein said electronic circuit portions are respectively formed, a plurality of separation regions (2, 3, 4) respectively formed between adjacent island regions and being electrically contiguous with said substrate, earth electrodes (9) for said substrate disposed on ones of said separation regions, substrate earth wiring (00) having first and second ends and being connected at first ends to said earth electrodes, a plurality of circuit earth wirings (500) having first and second ends and being connected at first ends to said electronic circuit portions, a common earth electrode formed on said semiconductor integrated circuit device and directly connected to the second ends of said substrate earth wirings and to a substantial majority of the second ends of said circuit earth wirings, a substantial minority of the second ends of said second earth wirings being electrically connected to adjacent ones of said substrate earth wirings, wherein a first of said electronic circuit portions is grounded via a first one of said circuit earth wirings, said first circuit earth wiring being electrically connected to one of said substrate earth electrodes via a substrate earth wiring, and wherein said second and further ones of said electronic circuit portions located directly adjacent said first electronic circuit portion are grounded via further ones of said circuit earth wirings, said further ones of said circuit earth wirings being electrically disconnected from said one substrate earth electrode, and being directly electrically connected to said common earth electrode.

* * * * *